(12) United States Patent
Luo et al.

(10) Patent No.: US 11,901,292 B2
(45) Date of Patent: Feb. 13, 2024

(54) MICROELECTRONIC DEVICES, MEMORY DEVICES, AND ELECTRONIC SYSTEMS

(71) Applicant: Micron Technology, Inc., Boise, ID (US)

(72) Inventors: Shuangqiang Luo, Boise, ID (US); Indra V. Chary, Boise, ID (US)

(*) Notice: Subject to any disclaimer, the term of this patent is extended or adjusted under 35 U.S.C. 154(b) by 0 days.

(21) Appl. No.: 17/819,019

(22) Filed: Aug. 11, 2022

(65) Prior Publication Data
US 2022/0384342 A1  Dec. 1, 2022

Related U.S. Application Data

(63) Continuation of application No. 16/952,913, filed on Nov. 19, 2020, now Pat. No. 11,424,184.

(51) Int. Cl.
| | | |
|---|---|---|
| *H01L 23/528* | (2006.01) | |
| *H01L 21/768* | (2006.01) | |
| *H01L 21/311* | (2006.01) | |
| *H01L 23/522* | (2006.01) | |
| *H10B 41/27* | (2023.01) | |
| *H10B 43/27* | (2023.01) | |

(52) U.S. Cl.
CPC .... *H01L 23/5283* (2013.01); *H01L 21/31144* (2013.01); *H01L 21/76804* (2013.01); *H01L 21/76877* (2013.01); *H01L 23/5226* (2013.01); *H10B 41/27* (2023.02); *H10B 43/27* (2023.02)

(58) Field of Classification Search
CPC .......... H01L 23/5283; H01L 21/31144; H01L 21/76804; H01L 21/76877; H01L 23/5226; H01L 27/11556; H01L 27/11582
See application file for complete search history.

(56) References Cited

U.S. PATENT DOCUMENTS

| | | | |
|---|---|---|---|
| 10,157,882 B2* | 12/2018 | Yu | ............ H01L 24/03 |
| 2016/0093635 A1 | 3/2016 | Rabkin et al. | |
| 2019/0214395 A1 | 7/2019 | Zhang et al. | |

(Continued)

FOREIGN PATENT DOCUMENTS

| | | |
|---|---|---|
| KR | 10-2014-0053392 A | 5/2014 |
| WO | 2018/161839 A1 | 9/2018 |

OTHER PUBLICATIONS

International Search Report for Application No. PCT/US2021/054677, dated Jan. 21, 2022, 3 pages.

(Continued)

*Primary Examiner* — Karen Kusumakar
(74) *Attorney, Agent, or Firm* — TraskBritt

(57) ABSTRACT

A microelectronic device comprises pillar structures comprising semiconductive material, contact structures in physical contact with upper portions of the pillar structures, and conductive structures over and in physical contact with the contact structures. Each of the conductive structures comprises an upper portion having a first width, and a lower portion vertically interposed between the upper portion and the contact structures. The lower portion has a tapered profile defining additional widths varying from a second width less than the first width at an uppermost boundary of the lower portion to a third width less than the second width at a lowermost boundary of the lower portion. Memory devices, electronic systems, and methods of forming microelectronic devices are also described.

20 Claims, 11 Drawing Sheets

(56) References Cited

U.S. PATENT DOCUMENTS

| | | |
|---|---|---|
| 2019/0341399 A1 | 11/2019 | Tao et al. |
| 2020/0126923 A1* | 4/2020 | Hu ..................... H01L 23/3128 |
| 2020/0176346 A1* | 6/2020 | Wu ..................... H01L 23/145 |
| 2020/0303300 A1* | 9/2020 | Kato .................. H01L 23/5283 |
| 2021/0202519 A1 | 7/2021 | Ku et al. |
| 2021/0257383 A1 | 8/2021 | Ochi et al. |
| 2021/0335802 A1 | 10/2021 | Chih-Hsiung |

OTHER PUBLICATIONS

Written Opinion of the International Searching Authority for Application No. PCT/US2021/054677, dated Jan. 21, 2022, 4 pages.

* cited by examiner

MICROELECTRONIC DEVICES, MEMORY DEVICES, AND ELECTRONIC SYSTEMS

CROSS-REFERENCE TO RELATED APPLICATION

This application is a continuation of U.S. patent application Ser. No. 16/952,913, filed Nov. 19, 2020, now U.S. Pat. No. 11,424,184, issued Aug. 23, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often seek to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes strings of memory cells vertically extending through openings in one or more decks (e.g., stack structures) including tiers of conductive structures and insulative structures. Each string of memory cells may include at least one select device coupled thereto. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Reducing the dimensions and spacing of memory device features places ever increasing demands on the methods used to form the memory device features. For example, 3D NAND Flash memory device manufacturers face a tremendous challenge on reducing vertical memory array area as feature spacing decreases to accommodate increased feature density. Reducing spacing between closely arranged conductive structures (e.g., conductive plug structures, conductive contact structures) coupling digit line structures to strings of memory cells may, for example, lead to undesirable electrical coupling (e.g., capacitive coupling) effects that can result in programming time (tPROG) margin loss for high-speed memory applications.

DETAILED DESCRIPTION

Figure 1A:
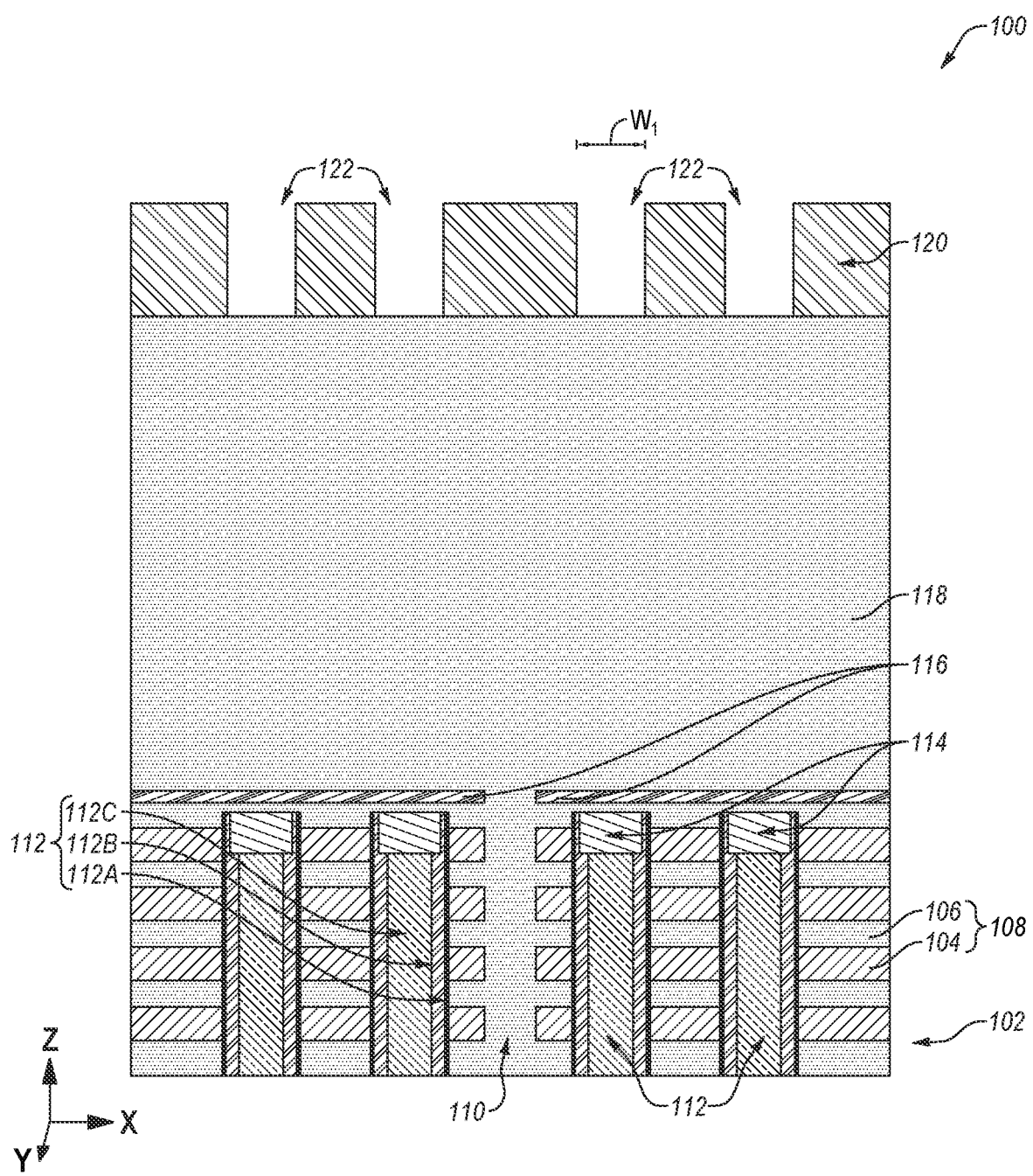
FIGS. 1A through 1I are partial cross-sectional views (FIGS. 1A through 1H) and a partial top-down view (FIG. 1I) illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1A through 1I are simplified partial cross-sectional views (FIGS. 1A through 1H) and a simplified partial top-down view (FIG. 1I) illustrating embodiments of a method of forming a microelectronic device (e.g., a memory device, such as a 3D NAND Flash memory device). The microelectronic devices formed through the methods of the disclosure may include configurations effectuating reduced capacitive coupling between conductive structures (e.g., conductive contact structures, conductive plug structures) as compared to conventional configurations. The microelectronic devices formed through the methods of the disclosure may have reduced conductive line (e.g., digit line, bit line) capacitance as compared to conventional microelectronic devices formed through conventional methods. With the description provided below, it will be readily apparent to one of ordinary skill in the art that the methods and structures described herein may be used in various devices and electronic systems.

Referring to FIG. 1A, a microelectronic device structure 100 may be formed to a stack structure 102; cell pillar structures 112 vertically extending (e.g., in the Z-direction) through the stack structure 102; pillar contact structures 114 on, over, and/or within upper portions (e.g., in the Z-direction) of the cell pillar structures 112; an etch stop material 116 over the stack structure 102, the cell pillar structures 112, and the pillar contact structures 114; a dielectric material 118 on or over the etch stop material 116; and a masking structure 120 on or over the dielectric material 118. The microelectronic device structure 100 also includes additional features (e.g., structures, materials, devices), as described in further detail below.

The stack structure 102 of the microelectronic device structure 100 includes a vertically alternating (e.g., in the Z-direction) sequence of conductive structures 104 and insulative structures 106 and arranged in tiers 108. Each of the tiers 108 of the stack structure 102 may include at least one of the conductive structures 104 vertically neighboring at least one of the insulative structures 106. In some embodiments, the conductive structures 104 are formed of and include tungsten (W) and the insulative structures 106 are formed of and include silicon dioxide ($SiO_2$). In additional embodiments, the conductive structures 104 are formed of and include a different conductive material (e.g., semiconductive material doped with at least one conductivity-enhancing dopant; a different metal; an alloy; a conductive metal-containing material), and/or the insulative structures 106 are formed of and include a different insulative material (e.g., a different dielectric oxide material, a dielectric nitride material, a dielectric oxynitride material, a dielectric oxycarbide material, a hydrogenated dielectric oxycarbide material, a dielectric carboxynitride material). The conductive structures 104 and insulative structures 106 of the tiers 108 of the stack structure 102 may each individually be substantially planar, and may each individually exhibit a desired thickness (e.g., vertical dimension in the Z-direction).

Optionally, one or more liner materials (e.g., insulative liner material(s), conductive liner material(s)) may be formed around the conductive structures 104 of the stack structure 102. The liner material(s) may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material(s) comprise at least one conductive material employed as a seed material for the formation of the conductive structures 104. In some embodiments, the liner material(s) comprise titanium nitride. In further embodiments, the liner material(s) further include aluminum oxide. As a non-limiting example, aluminum oxide may be formed directly adjacent the insulative structures 106, titanium nitride may be formed directly adjacent the aluminum oxide, and tungsten may be formed directly adjacent the titanium nitride. For clarity and ease of understanding the description, the liner material(s) are not illustrated in FIG. 1A, but it will be understood that the liner material(s) may be disposed around the conductive structures 104.

At least one vertically lower (e.g., in the Z-direction) conductive structure 104 of the stack structure 102 may be employed as at least one first select gate (e.g., at least one source side select gate (SGS), lower select gates). In some embodiments, a conductive structure 104 of a vertically lowermost tier 108 of the stack structure 102 is employed as a first select gate (e.g., a SGS). In addition, one or more vertically upper (e.g., in the Z-direction) conductive structures 104 of the stack structure 102 may be employed as second select gate(s) (e.g., drain side select gate(s) (SGDs), upper select gates). In some embodiments, horizontally neighboring (e.g., in the X-direction) conductive structures 104 of at least one vertically upper tier 108 of the stack structure 102 are employed as second select gates (e.g., SGDs).

The stack structure 102 may further include one or more filled slots 110 at least partially vertically extending therethrough. The filled slots 110 may comprise slots (e.g., slits, trenches, openings) at least partially (e.g., substantially) filled with at least one insulative material. In some embodiments, the filled slots 110 comprise slots filled with dielectric oxide material (e.g., $SiO_x$, such as $SiO_2$). One or more of the filled slots 110 may vertically extend only partially (e.g., less than completely) through the stack structure 102, such as through less than or equal to eight (8) (e.g., less than or equal to four (4)) upper tiers 108 of the stack structure 102. The one or more of filled slots 110 may, for example, be employed to horizontally separate and electrically isolate conductive structures 104 employed as the second select gates (e.g., SGDs, upper select gates) within individual upper tiers 108 of the stack structure 102. In addition, one or more other of the filled slots 110 may vertically extend completely through the stack structure 102. The one or more other of the filled slots 110 may, for example, be employed to partition (e.g., divide) the stack structure 102 into multiple (e.g., more than one) blocks.

With continued reference to FIG. 1A, the cell pillar structures 112 may each individually be formed of and include multiple (e.g., a plurality) materials facilitating the formation of vertically extending (e.g., in the Z-direction) strings of memory cells within the stack structure 102. By way of non-limiting example, each of the cell pillar structures 112 may individually be formed to include an outer material stack 112A, a channel material 112B inwardly horizontally adjacent the outer material stack 112A, and a fill material 112C inwardly horizontally adjacent the channel material 112B.

The outer material stack 112A of each of the cell pillar structures 112 may include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); and a tunnel dielectric material, such as a second oxide dielectric material (e.g., $SiO_x$, such as $SiO_2$). The tunnel dielectric material may be outwardly horizontally surrounded by the charge-trapping material; and the charge-trapping material may be outwardly horizontally surrounded by the charge-blocking material. In some embodiments, the outer material stack 112A of each of the cell pillar structures 112 comprises an oxide-nitride-oxide (ONO) stack.

The channel material 112B of each of the cell pillar structures 112 may be formed of and include semiconductive material, such as one or more of silicon, (e.g., polycrystalline silicon), germanium, silicon-germanium, and oxide semiconductive material. In some embodiments, the channel material 112B comprises polycrystalline silicon. The polycrystalline silicon may be doped with one or more conductivity-enhancing dopant (e.g., at least one P-type dopant, such as one or more of boron, aluminum, and gallium; or at least one N-type dopant, such as one or more of phosphorus, arsenic, antimony, and bismuth) or may be substantially undoped. In additional embodiments, the channel material 112B comprises at least one oxide semiconductive material having a band gap larger than that polycrystalline silicon, such as a band gap larger than 1.65 electronvolts (eV). By way of non-limiting example, the channel material 112B may be formed of and include one or more of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. The channel material 112B may be substantially homogeneous, or the channel material 112B may be heterogeneous. As shown in FIG. 1A, the channel material 112B of each cell pillar structure 112 may be outwardly horizontally surrounded by the outer material stack 112A (e.g., tunnel dielectric material of the outer material stack 112A) of the cell pillar structure 112.

The fill material 112C of each of the cell pillar structures 112 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), at least one dielectric carboxynitride material (e.g., $SiO_xC_zN_y$), and air. In some embodiments, the fill material 112C is formed of and includes at least one dielectric oxide material (e.g., $SiO_x$, such as $SiO_2$). In additional embodiments, the fill material 112C is formed of and includes at least one dielectric nitride material (e.g., $SiN_y$, such as $Si_3N_4$). The fill material 112C may be substantially homogeneous, or the fill material 112C may be heterogeneous. As shown in FIG. 1A, the fill material 112C of each cell pillar structure 112 may be outwardly horizontally surrounded by the channel material 112B of the cell pillar structure 112.

As described in further detail below with reference to FIG. 2, intersections of the cell pillar structures 112 and the conductive structures 104 of at least some of the tiers 108 of the stack structure 102 may define vertically extending strings of memory cells coupled in series with one another within the stack structure 102. In some embodiments, the memory cells formed at the intersections of the conductive structures and the cell pillar structures 112 within each the tiers of the stack structure comprise so-called "MONOS" (metal-oxide-nitride-oxide-semiconductor) memory cells. In additional embodiments, the memory cells comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells comprise so-called "floating gate" memory cells including floating gates (e.g., metallic floating gates) as charge storage structures. The floating gates may horizontally intervene between central structures of the cell pillar structures 112 and the conductive structures of the different tiers of the stack structure.

Still referring to FIG. 1A, the pillar contact structures 114 may contact (e.g., physically contact, electrically contact) the channel material 112B of the cell pillar structures 112. As shown in FIG. 1A, in some embodiments, the pillar contact structures 114 at least partially (e.g., substantially) vertically extend into the cell pillar structures 112. For individual pillar contact structures 114, at least a portion thereof may be positioned within vertical boundaries of an individual cell pillar structure 112, and may be horizontally surrounded by and contact (e.g., physically contact, electrically contact) the channel material 112B of the cell pillar structure 112 at inner horizontal boundaries (e.g., inner sidewalls) of the channel material 112B. In some embodiments, uppermost vertical boundaries (e.g., uppermost surfaces) of the pillar contact structures 114 are substantially coplanar with uppermost vertical boundaries (e.g., uppermost surfaces) of the cell pillar structures 112. In additional embodiments, uppermost vertical boundaries of one or more of the pillar contact structures 114 are offset from (e.g., vertically overlie) the uppermost vertical boundaries of the cell pillar structures 112. For example, for individual pillar contact structures 114, a vertically upper portion thereof may be located vertically above an uppermost vertical boundary of the cell pillar structure 112 in contact therewith. A vertically upper portion of an individual pillar contact structure 114 may, for example, horizontally extend beyond horizontal boundaries of the vertically lower portion of the pillar contact structure 114 within vertical boundaries of an individual cell pillar structure 112, and may contact (e.g., physically contact, electrically contact) the channel material 112B of the individual cell pillar structure 112 at the uppermost vertical boundary of the channel material 112B.

The pillar contact structures 114 may be formed of and include conductive material. As a non-limiting example, the pillar contact structures 114 may each individually be formed of and include one or more of at least one conductively doped semiconductive material, at least one metal, at least one alloy, and at least one conductive metal-containing material (e.g., a conductive metal nitride, a conductive metal silicide, a conductive metal carbide, a conductive metal oxide). In some embodiments, each of the pillar contact structures 114 is formed of and includes polycrystalline silicon doped with one or more conductivity-enhancing dopants (e.g., one or more N-type dopants, one or more P-type dopants). Each of the pillar contact structures 114 may individually be substantially homogeneous, or one or more of the pillar contact structures 114 may individually be heterogeneous.

Still referring to FIG. 1A, the etch stop material 116 may be formed to horizontally extend (e.g., in the X-direction and the Y-direction) over the stack structure 102, and may cover the pillar contact structures 114 and the cell pillar structures 112. The etch stop material 116 may protect the pillar contact structures 114 and the cell pillar structures 112 during subsequent patterning of the dielectric material 118 for the formation of contact structures of the disclosure, as described in further detail below. As shown in FIG. 1A, the filled slots 110 may also vertically extend through the etch stop material 116. The filled slots 110 may horizontally intervene between and separate different horizontal portions of the etch stop material 116.

The etch stop material 116 may be formed of and include at least one material having etch selectively relative to the dielectric material 118. The dielectric material 118 may be selectively etchable relative to the etch stop material 116 during common (e.g., collective, mutual) exposure to a first etchant; and the etch stop material 116 may be selectively etchable relative to the dielectric material 118 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. In some embodiments, the etch stop material 116 is formed of and includes a carbon nitride material ($CN_x$). The etch stop material 116 may be substantially homogeneous, or the etch stop material 116 may be heterogeneous.

The dielectric material 118 may be formed of and include at least one insulative material that may be selectively removed relative to the etch stop material 116, as described in further detail below. A material composition of the dielectric material 118 is different than a material composition of the etch stop material 116. The material composition of the dielectric material 118 may be substantially the same as a material composition of the filled slots 110 and a material composition of the insulative structures 106 of the stack structure 102, or the material composition of the dielectric material 118 may be different than the material composition the filled slots 110 and/or the material composition the insulative structures 106 of the stack structure 102. By way of non-limiting example, the dielectric material 118 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, dielectric material 118 is formed of and includes a dielectric oxide material (e.g., $SiO_x$, such as $SiO_2$). The dielectric material 118 may be substantially homogeneous, or the dielectric material 118 may be heterogeneous.

The masking structure 120 may be formed of and include at least one material (e.g., at least one hard mask material) suitable for use as an etch mask to pattern portions of the dielectric material 118 and the etch stop material 116 to form apertures (e.g., openings, vias) vertically extending to the pillar contact structures 114 and having desirable geometric configurations (e.g., shapes, dimensions), as described in further detail below. By way of non-limiting example, the masking structure 120 may be formed of and include one or more hard mask materials having etch selectivity relative to at least the dielectric material 118. In some embodiments, the masking structure 120 is formed of and includes one or more of amorphous carbon and doped amorphous carbon (e.g., boron-doped amorphous carbon, such as boron-doped amorphous carbon comprising at least 1 weight percent (wt %) boron and at least 20 wt % carbon, such as between about 1 wt % boron and about 40 wt % boron, and between about 99 wt % carbon and about 60 wt % carbon). The masking structure 120 may be substantially homogeneous, or the masking structure 120 may be heterogeneous.

As shown in FIG. 1A, the masking structure 120 may be formed to exhibit first openings 122 vertically extending (e.g., in the Z-direction) therethrough. The first openings 122 may vertically extend completely through the masking structure 120, from an uppermost vertical boundary (e.g., an uppermost surface) of the masking structure 120 to a lowermost vertical boundary (e.g., a lowermost surface) of the masking structure 120. The first openings 122 may vertically extend to and expose portions of the dielectric material 118 underlying the masking structure 120. Exposed portions of the dielectric material 118 may define lowermost vertical boundaries (e.g., floors, bottoms) of the first openings 122.

Figure 1B:
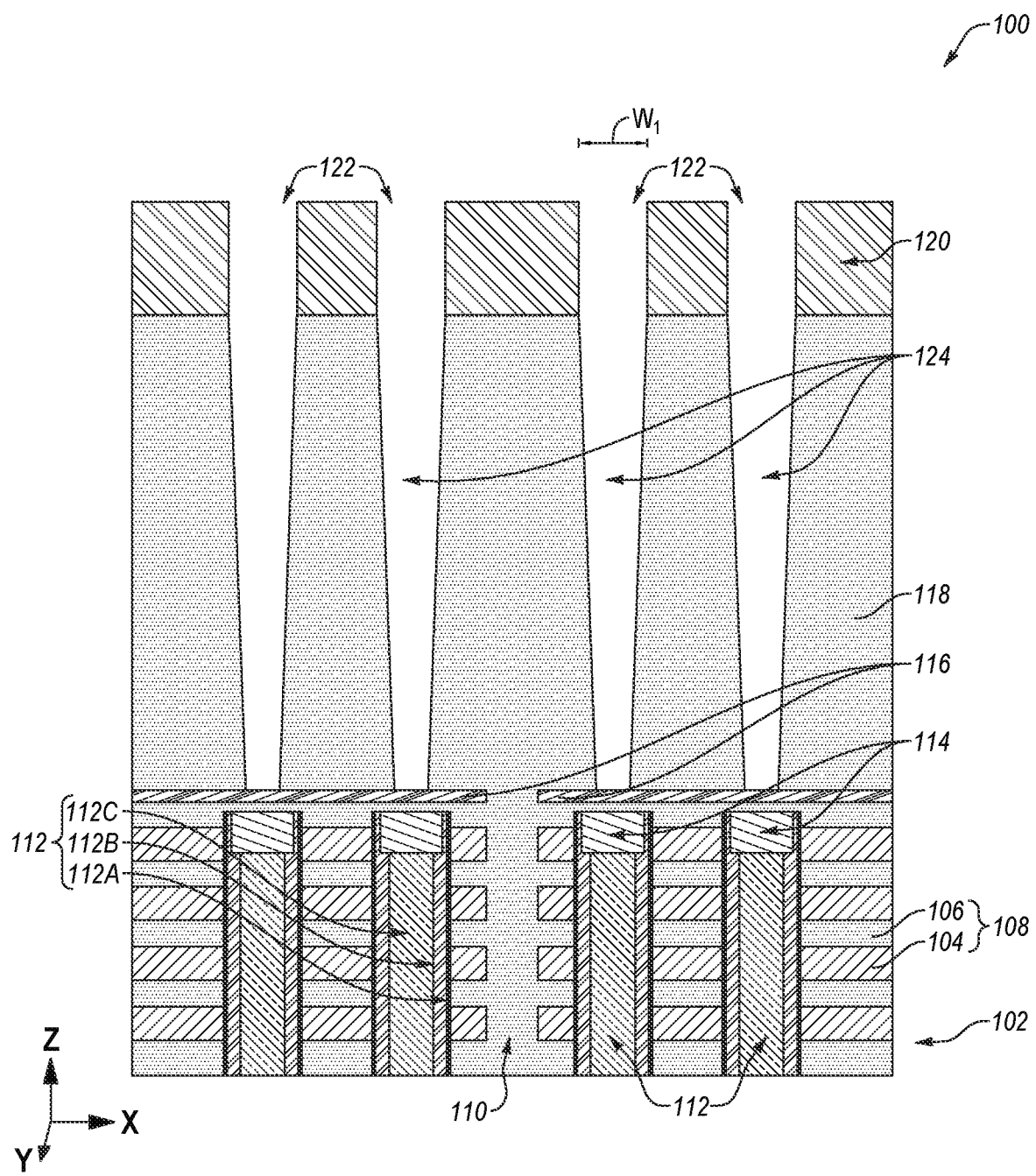

A geometric configuration (e.g., shape, dimensions), horizontal position (e.g., in the X-direction and in the Y-direction), and horizontal spacing of each of the first openings 122 in the masking structure 120 at least partially depends on the geometric configurations, horizontal positions, and horizontal spacing of the pillar contact structures 114 and the cell pillar structures 112. The first openings 122 may be formed to be at least partially horizontally aligned (e.g., in the X-direction and in the Y-direction) with the pillar contact structures 114 and the cell pillar structures 112. In addition, the first openings 122 may be formed to have horizontal dimensions (e.g., in the X-direction and in the Y-direction) less than or equal to corresponding horizontal dimensions of the cell pillar structures 112, such as less than or equal to corresponding horizontal dimensions of the pillar contact structures 114. As shown in FIG. 1B, in some embodiments, horizontal centers of the first openings 122 are formed to be substantially horizontally aligned with horizontal centers of the pillar contact structures 114. In addition, as also shown in FIG. 1B, in some embodiments, a first width W1 (e.g., diameter) of each of the first openings 122 is formed to be less than or equal to a width of the pillar contact structure 114 at least partially (e.g., substantially) horizontally aligned therewith.

In some embodiments, the first openings 122 are formed to exhibit substantially the same geometric configurations (e.g., substantially the same shapes and substantially the same dimensions) as one another. For example, each of the first openings 122 may be formed to exhibit a substantially circular horizontal cross-sectional shape, and may have substantially the same first width W1 (e.g., diameter) as each other of the first openings 122. In additional embodiments, one or more of the first openings 122 is formed to exhibit a different geometric configuration (e.g., a non-circular horizontal cross-sectional shape, such as such as one or more of an oblong shape, an elliptical shape, a square shape, a rectangular shape, a tear drop shape, a semicircular shape, a tombstone shape, a crescent shape, a triangular shape, a kite shape, and an irregular shape; and/or different dimensions, such as a smaller width or a larger width) than one or more other of the first openings 122. For example, one or more of the first openings 122 may be formed to exhibit another width different than (e.g., larger than, smaller than) the first width $W_1$.

The masking structure 120, including the first openings 122 therein, may be formed by patterning (e.g., photolithographically patterning through selective photoexposure and development) a masking material (e.g., a resist material, such as a photoresist material) overlying material (e.g., hard mask material, such as amorphous carbon) of the masking structure 120, and then transferring the resulting pattern into the material by way of at least one material removal process (e.g., at least one etching process, such as at least one anisotropic etching process) to form the masking structure 120. Thereafter, remaining portions of the masking material (if any) may be removed.

Referring next to FIG. 1B, portions of the dielectric material 118 within horizontal boundaries of the first openings 122 in the masking structure 120 are removed to form first apertures 124 vertically extending (in the Z-direction) completely through the dielectric material 118. The first apertures 124 may expose portions of the etch stop material 116 underlying the dielectric material 118. Exposed portions of the etch stop material 116 may define lowermost vertical boundaries (e.g., floors, bottoms) of the first apertures 124. In some embodiments, the first apertures 124 are formed to vertically terminate at uppermost vertical boundaries (e.g., uppermost surfaces) of the etch stop material 116, such that lower vertical boundaries of the first apertures 124 are substantially coplanar with the uppermost vertical boundaries of the etch stop material 116. In additional embodiments, the first apertures 124 are formed to vertically extend into the etch stop material 116, such that lower vertical boundaries of the first apertures 124 are within vertical boundaries (e.g., between a lowermost vertical boundary and an uppermost vertical boundary) of the etch stop material 116.

As shown in FIG. 1B, horizontal dimensions of each of the first apertures 124 in the dielectric material 118 may progressively decrease from relatively larger (e.g., wider, greater) horizontal dimensions at an uppermost vertical boundary (e.g., an uppermost surface) of the dielectric material 118 to relatively smaller (e.g., narrower) horizontal dimensions toward and at a lowermost vertical boundary (e.g., a lowermost surface) of the dielectric material 118. Put another way, each first aperture 124 may exhibit tapering between horizontal cross-sectional areas of relatively vertical higher portions thereof (e.g., portions relatively more proximate the masking structure 120) and relatively lower portions thereof (e.g., portions relatively more proximate the etch stop material 116). For example, the first apertures 124 may individually exhibit different horizontal widths decreasing in a downward vertical direction (e.g., the negative Z-direction) from the first width $W_1$ of the first openings 122 in the masking structure 120 at the uppermost vertical boundary of the dielectric material 118 to an additional width relatively smaller than the first width $W_1$ at the lower vertical boundary of the dielectric material 118. The additional width may be less than the width of an individual pillar contact structure 114.

The first apertures 124 may be formed by subjecting the microelectronic device structure 100 at the processing stage depicted in FIG. 1A to at least one material removal process. The material removal process may, for example, comprise at least one anisotropic etching process (e.g., an anisotropic dry etching process, such as reactive ion etching (RIE), deep RIE, plasma etching, reactive ion beam etching, chemically assisted ion beam etching; an anisotropic wet etching process) employing at least one etchant more selective to the dielectric material 118 than the masking structure 120 and the etch stop material 116. The material removal process may remove portions of the dielectric material 118 within horizontal boundaries of the first openings 122 in the masking structure 120 without substantially removing additional portions of the dielectric material 118 outside of the horizontal boundaries of the first openings 122 in the masking structure 120.

Figure 1C:
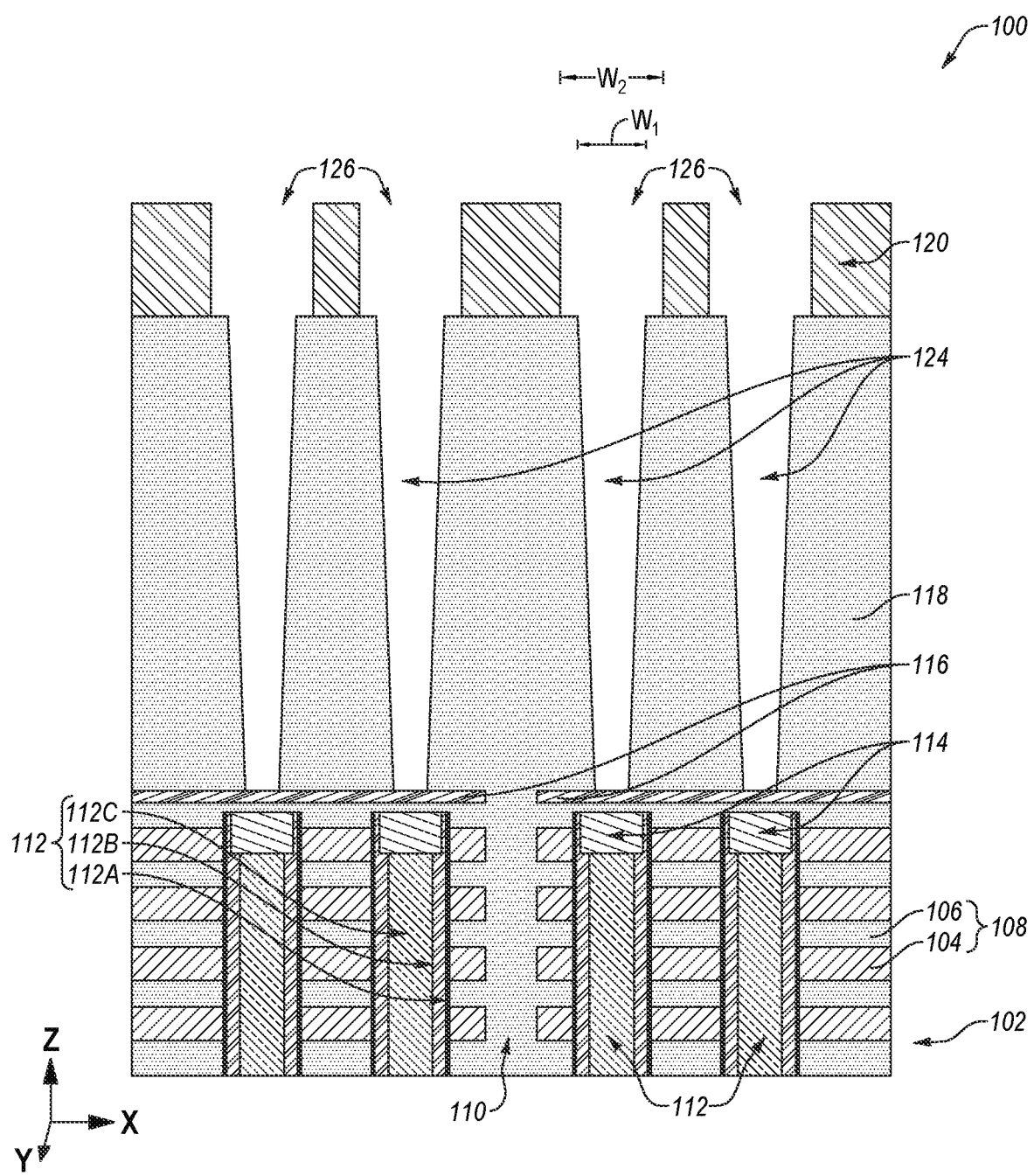

Referring next to FIG. 1C, portions of the masking structure 120 horizontally adjacent the first openings 122 (FIG. 1B) therein may be removed (e.g., trimmed) to form second openings 126 from the first openings 122 (FIG. 1B). The second openings 126 may vertically extend completely through the masking structure 120, and may exhibit greater (e.g., larger, wider) horizontal dimensions than the first openings 122 (FIG. 1B). For example, as shown in FIG. 1C, the second openings 126 may individually have a second width W2 greater than the first width $W_1$ of individual first openings 122 (FIG. 1B). The horizontal dimensions of individual second openings 126 may be greater than the largest horizontal dimensions of individual first apertures 124 in the dielectric material 118. The second width $W_2$ of an individual second opening 126 may, for example, be greater than the largest width (e.g., the first width $W_1$) of an individual first aperture 124 vertically underlying the second opening 126. As depicted in FIG. 1C, the second openings 126 may expose (e.g., uncover) portions of an upper surface of the dielectric material 118 previously covered by material (e.g., hard mask material) of the masking structure 120.

The second openings 126 in the masking structure 120 may be formed to be substantially horizontally aligned (e.g., in the X-direction and in the Y-direction) with the first apertures 124 in the dielectric material 118. For example, substantially equal amounts of the masking structure 120 surrounding the first openings 122 (FIG. 1B) may be removed (e.g., trimmed) in each horizontal direction (e.g., the positive X-direction, the negative X-direction, the positive Y-direction, the negative Y-direction) to form the second openings 126, such that horizontal centers of the second openings 126 are substantially horizontally aligned with horizontal centers of the first apertures 124.

The second openings 126 may be formed by subjecting the microelectronic device structure 100 at the processing stage depicted in FIG. 1B to at least one additional material removal process. The additional material removal process may, for example, comprise an etching process employing at least one etchant more selective to the masking structure 120 than the dielectric material 118. In some embodiments, such as embodiments wherein the masking structure 120 comprises amorphous carbon and the dielectric material 118 comprises a dielectric oxide material (e.g., $SiO_x$, such as $SiO_2$), the etching process comprises of oxygen plasma etching process employing oxygen plasma as an etchant. The additional material removal process may remove portions of the masking structure 120 without substantially removing portions of the dielectric material 118 remaining following the processing stage previously described with reference to FIG. 1B.

In additional embodiments, rather than removing (e.g., trimming) portions of the masking structure 120 to form the second openings 126, the masking structure 120 may instead be substantially completely removed and replaced with an additional masking structure exhibiting the configurations and positions of the second openings 126. Following the removal of the masking structure 120, the additional masking structure may be provided on or over the dielectric material 118 for subsequent processing of the dielectric material 118. In such embodiments, subsequent processing of the dielectric material 118 may proceed in a manner substantially similar to that described below with respect to additional processing of the microelectronic device structure 100 following the processing stage previously described with reference to FIG. 1C. For example, subsequent processing acts described hereinbelow that employ the masking structure 120 (including the second openings 126 therein) may instead employ the additional masking structure in place of the masking structure 120.

Figure 1D:
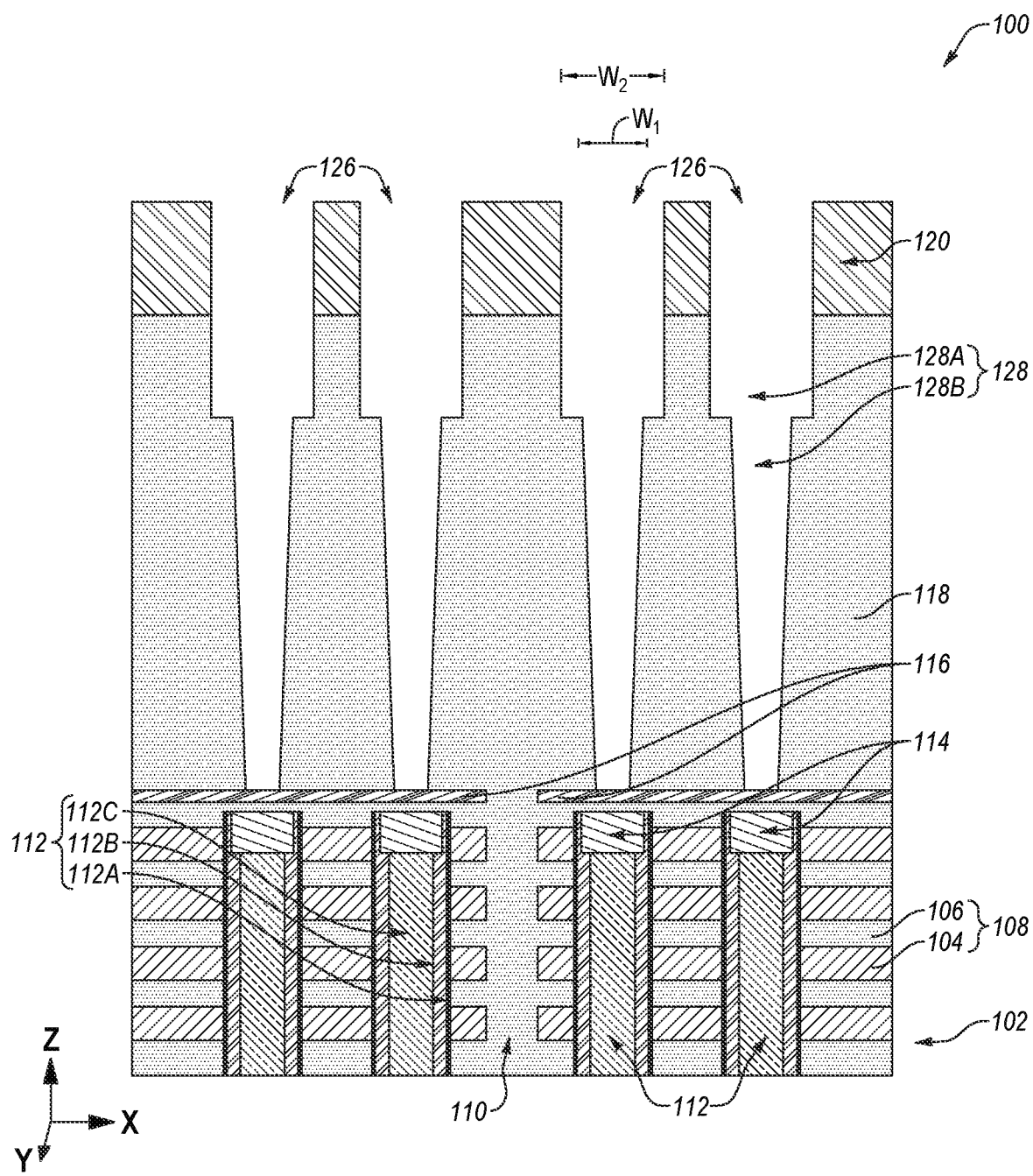

Referring next to FIG. 1D, portions of the dielectric material 118 and the etch stop material 116 adjacent the first apertures 124 (FIG. 1C) may be removed to form second apertures 128. The removal process may extend (e.g., expand) horizontal dimensions of upper portions of the first apertures 124 (FIG. 1C), and may also extend a vertical depth of the first apertures 124 (FIG. 1C). The second apertures 128 may vertically extend to and expose portions of the pillar contact structures 114. The exposed portions of the pillar contact structures 114 may at least partially (e.g., substantially) define lowermost vertical boundaries (e.g., floors, bottoms) of the second apertures 128. In some embodiments, the second apertures 128 are formed to vertically terminate at uppermost vertical boundaries (e.g., uppermost surfaces) of the pillar contact structures 114, such that lower vertical boundaries of the second apertures 128 are substantially coplanar with the uppermost vertical boundaries of the pillar contact structures 114. In additional embodiments, the second apertures 128 are formed to vertically extend into the pillar contact structures 114, such that lowermost vertical boundaries of the second apertures 128 are within vertical boundaries (e.g., between lowermost vertical boundaries and uppermost vertical boundaries) of the pillar contact structures 114.

As shown in FIG. 1D, each of the second apertures 128 may individually include a first portion 128A (e.g., an upper portion) partially (e.g., less than completely) vertically extending through the dielectric material 118, and a second portion 128B vertically interposed between the first portion 128A and the pillar contact structures 114. The first portion 128A may be integral and continuous with the second portion 128B. The first portion 128A of an individual second aperture 128 may vertically extend from an uppermost vertical boundary (e.g., an uppermost surface) of the dielectric material 118, and may vertically extend a distance less than or equal to one-half (e.g., less than or equal to one-third, less than or equal to one-fourth) a maximum distance between the pillar contact structures 114 and the masking structure 120. In addition, the second portion 128B of an individual second aperture 128 may vertically extend from a lowermost vertical boundary of the first portion 128A to an uppermost vertical boundary (e.g., an uppermost surface) of an individual pillar contact structure 114.

As shown in FIG. 1D, the first portion 128A of an individual second aperture 128 may exhibit substantially the same horizontal dimensions as the horizontal dimensions of an individual second opening 126 in the masking structure 120. For example, the first portion 128A of each of the second apertures 128 may be formed to exhibit the second width W2. The first portion 128A of an individual second aperture 128 may be formed to exhibit horizontal boundaries that are oriented substantially perpendicular (e.g., orthogonal) to upper vertical boundaries (e.g., upper surfaces) of the pillar contact structures 114 and the cell pillar structures 112. Put another way, horizontal boundaries of the first portion 128A may be oriented in parallel with horizontal boundaries (e.g., side surfaces, sidewalls) of the pillar contact structures 114 and the cell pillar structures 112. As used herein, the term "parallel" means substantially parallel.

Still referring to FIG. 1D, horizontal dimensions of the second portion 128B of an individual second aperture 128 may progressively decrease from relatively larger (e.g., wider, greater) horizontal dimensions at the lowermost vertical boundary of the first portion 128A of the second aperture 128 to relatively smaller (e.g., narrower) horizontal dimensions toward and at the uppermost vertical boundary of an individual pillar contact structure 114. Put another way, the second portion 128B may exhibit tapering between horizontal cross-sectional areas of relatively vertical higher regions thereof (e.g., regions relatively more proximate the first portion 128A) and relatively lower regions thereof (e.g., region relatively more proximate the pillar contact structure 114). Accordingly, the second portion 128B may exhibit horizontal boundaries that are not oriented perpendicular to the upper vertical boundaries of the pillar contact structures 114 and the cell pillar structures 112. A largest width of the second portion 128B (e.g., a width at the lowermost vertical boundary of the first portion 128A) of an individual second aperture 128 may be less than the second width W2 of the first portion 128A of the second aperture 128, and may also be less than a largest width of the first aperture 124 (FIG. 1C) (e.g., a width at a lowermost vertical boundary of the masking structure 120) from which the second aperture 128 is formed. Furthermore, a smallest width of the second portion 128B (e.g., a width at the uppermost vertical boundary of an individual pillar contact structure 114) may be less than a smallest width of the first aperture 124 (FIG. 1C) (e.g., a width at an uppermost vertical boundary of the etch stop material 116) from which the second aperture 128 is formed.

The second apertures 128 may be formed by subjecting the microelectronic device structure 100 at the processing stage depicted in FIG. 1C to at least one further material removal process. The further material removal process may, for example, comprise a first etching process (e.g., an anisotropic etching process) to remove additional portions of the dielectric material 118 and form the first portions 128A of the second apertures 128, and a second etching process (e.g., a so-called "punch through" etch) to remove (e.g., punch through) portions of the etch stop material 116 and expose upper surfaces of the pillar contact structures 114.

Figure 1E:
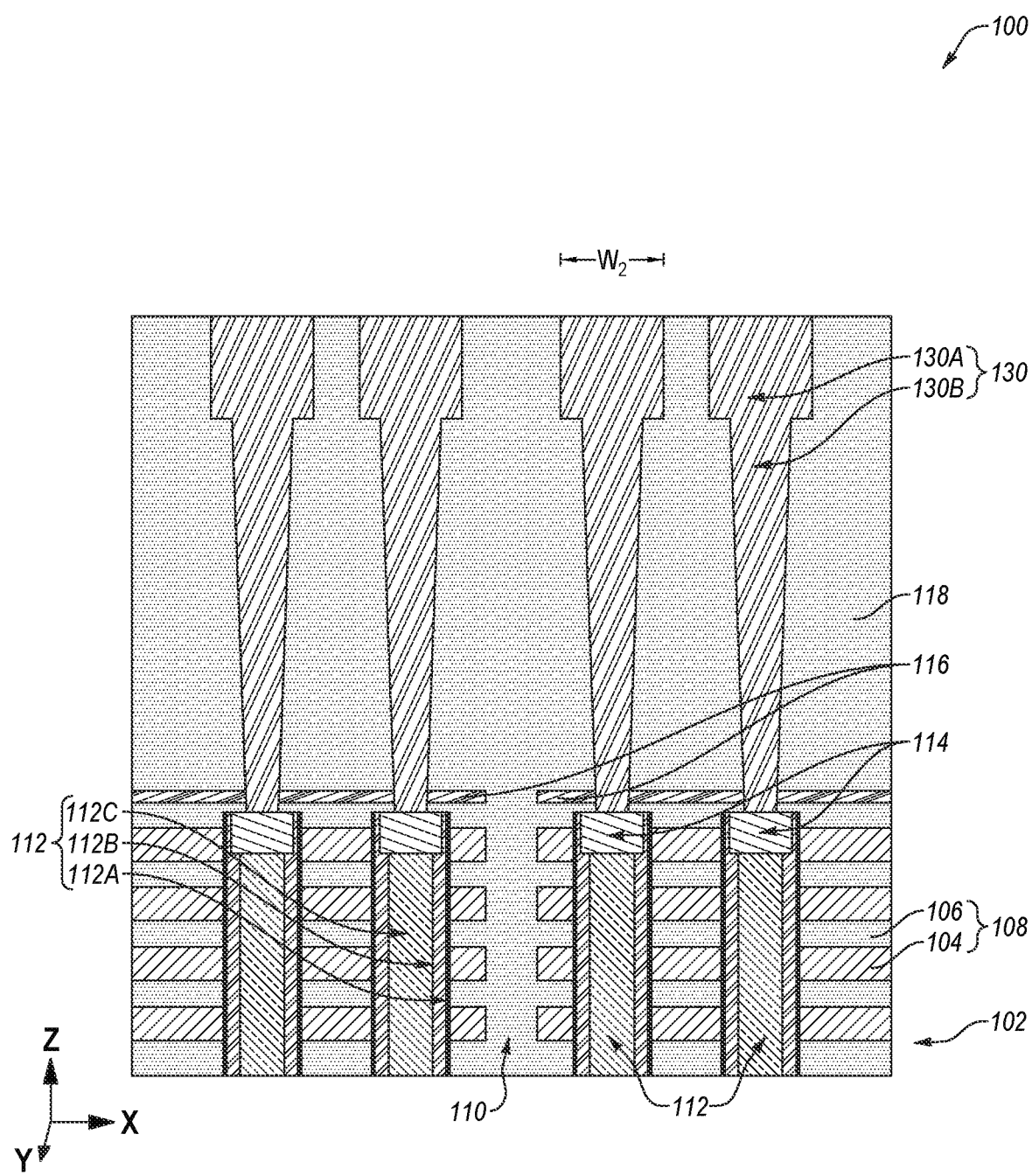

Referring next to FIG. 1E, a remainder (if any) of the masking structure 120 may be removed, and plug structures 130 may be formed inside the second apertures 128 (FIG. 1A). The plug structures 130 may be substantially confined within boundaries (e.g., horizontal boundaries, vertical boundaries) of the second apertures 128 (FIG. 1D), and may substantially fill the second apertures 128 (FIG. 1D). Each plug structure 130 may exhibit an uppermost vertical boundary (e.g., an uppermost surface) substantially coplanar with an uppermost vertical boundary (e.g., an uppermost surface) of the dielectric material 118, and a lowermost vertical boundary (e.g., a lowermost surface) vertically adjacent an uppermost vertical boundary (e.g., an uppermost surface) of an individual pillar contact structure 114.

As shown in FIG. 1E, each of the plug structures 130 may individually include a first portion 130A (e.g., an upper portion) partially (e.g., less than completely) vertically extending through the dielectric material 118, and a second portion 130B vertically interposed between the first portion 130A and the pillar contact structures 114. The first portion 130A of an individual plug structure 130 may have a geometric configuration (e.g., shape, dimensions) corresponding to (e.g., substantially the same as) a geometric configuration of the first portion 128A (FIG. 1D) of an individual second aperture 128 (FIG. 1D) filled with the plug structure 130. In addition, the second portion 130B of an individual plug structure 130 may have a geometric configuration (e.g., shape, dimensions) corresponding to (e.g., substantially the same as) a geometric configuration of the second portion 128B (FIG. 1D) of an individual second aperture 128 (FIG. 1D) filled with the plug structure 130.

The plug structures 130 may be formed of and include conductive material. As a non-limiting example, the plug structures 130 may be formed of and include one or more of at least one metal, at least one alloy, and at least one conductive metal-containing material (e.g., a conductive metal nitride, a conductive metal silicide, a conductive metal carbide, a conductive metal oxide). A material composition of the plug structures 130 may be substantially the same as a material composition of the pillar contact structures 114, or the material composition of the plug structures 130 may be different than the material composition of the pillar contact structures 114. In some embodiments, the plug structures 130 are individually formed of and includes W. The plug structures 130 may individually be homogeneous, or the plug structures 130 may individually be heterogeneous.

The plug structures 130 may be formed by removing remaining portions (if any) of the masking structure 120 (FIG. 1D) overlying the dielectric material 118, forming (e.g., non-conformably depositing, such as through one or more of a non-conformal PVD process and a non-conformal CVD process) conductive material inside and outside of the second apertures 128 (FIG. 1D), and then removing (e.g., through an abrasive planarization process, such as a CMP process) portions of the conductive material overlying an uppermost vertical boundary (e.g., an uppermost surface) of the dielectric material 118.

Forming the plug structures 130 to have the geometric configuration described with reference to FIGS. 1D and 1E may effectuate a reduction in capacitive coupling between horizontally neighboring plug structures 130 of the microelectronic device structure 100 as compared to capacitive coupling between conventional plug structures having conventional geometric configurations. For example, the geometric configurations of the first portion 130A and the second portion 130B of each of the plug structures 130 of the disclosure may reduce capacitive coupling between horizontally neighboring plug structures 130 relative to conventional geometric configurations simply exhibiting gradual tapering between horizontal cross-sectional areas of relatively higher portions of a plug structure and relatively lower portions of the plug structure. Accordingly, the geometric configurations of the plug structures 130 of the disclosure may enhance the performance (e.g., reduce tPROG) of microelectronic devices (e.g., memory devices, such as 3D NAND Flash memory devices) of the disclosure including the plug structures 130 as compared to conventional microelectronic devices including plug structures having conventional geometric configurations.

Figure 1F:
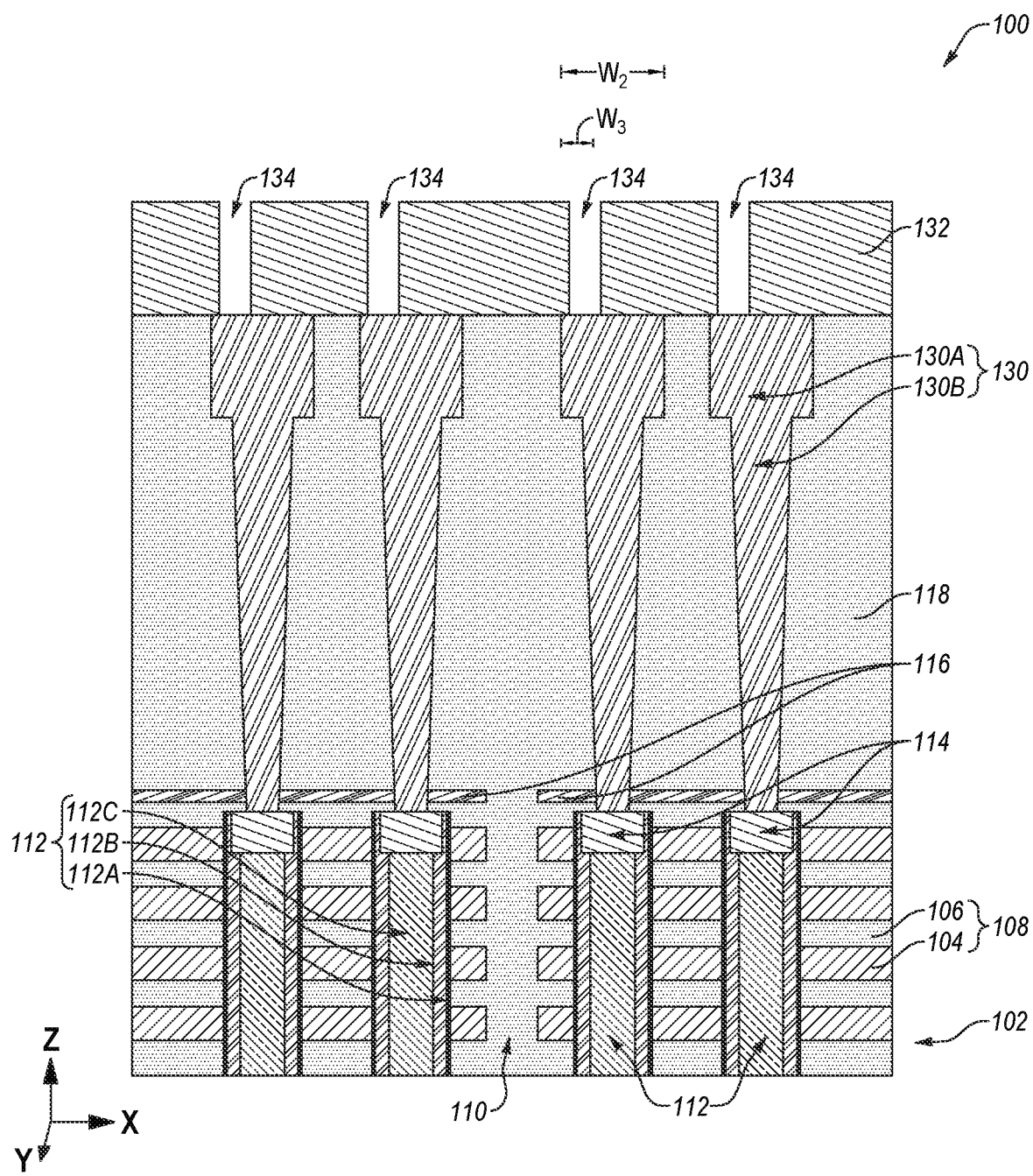

Referring next to FIG. 1F, additional dielectric material 132 may be formed on or over the dielectric material 118 and the plug structures 130, and then additional openings 134 (e.g., vias, apertures) may be formed to vertically extend through the additional dielectric material 132. The additional openings 134 may vertically extend (e.g., in the Z-direction) completely through the additional dielectric material 132. The additional openings 134 may vertically extend to and expose portions of the plug structures 130 underlying the additional dielectric material 132. Exposed portions of the plug structures 130 may define lowermost vertical boundaries (e.g., floors, bottoms) of the additional openings 134.

The additional dielectric material 132 may be formed of and include at least one insulative material. A material composition of the additional dielectric material 132 may be substantially the same as a material composition of the dielectric material 118, or the material composition of the additional dielectric material 132 may be different than the material composition of the dielectric material 118. As a non-limiting example, the additional dielectric material 132 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, the additional dielectric material 132 is formed of and includes a dielectric oxide material (e.g., $SiO_x$, such as $SiO_2$). The additional dielectric material 132 may be substantially homogeneous, or the additional dielectric material 132 may be heterogeneous.

A geometric configuration (e.g., shape, dimensions) and horizontal position (e.g., in the X-direction and in the Y-direction) of each of the additional openings 134 at least partially depends on the geometric configurations and horizontal positions of the plug structures 130. Each additional opening 134 may be formed to have horizontal dimensions (e.g., in the X-direction and in the Y-direction) less than or equal to horizontal dimensions of an uppermost vertical boundary (e.g., an uppermost surface) of an individual plug structure 130 thereunder. As shown in FIG. 1F, in some embodiment, each additional opening 134 is formed to exhibit a third width $W_3$ less than the second width $W_2$ of the first portion 130A of the plug structure 130 associated therewith (e.g., partially exposed thereby). A horizontal area of at least lowermost vertical boundary of each additional opening 134 is less than a horizontal area of an uppermost vertical boundary of the plug structure 130 associated therewith (e.g., partially exposed thereby). The horizontal area of the lowermost vertical boundary of each additional opening 134 may be less than, equal to, or greater than a horizontal area of an uppermost vertical boundary of the additional opening 134. In some embodiments, the horizontal area of the lowermost vertical boundary of each additional opening 134 is substantially equal to than the horizontal area of the uppermost vertical boundary of the additional opening 134, such that horizontal boundaries of each additional opening 134 extend substantially perpendicular to uppermost vertical boundaries of the plug structures 130. In additional embodiments, the horizontal area of the lowermost vertical boundary of each additional opening 134 is less than the horizontal area of the uppermost vertical boundary of the additional opening 134, such that the additional opening 134 exhibits a tapered cross-sectional profile in one or more vertical planes (e.g., the ZY-plane, the ZX-plane). In addition, each additional opening 134 may be formed to have a desired horizontal cross-sectional shape (e.g., in the XY-plane). In some embodiments, each additional opening 134 is formed to exhibit a substantially circular horizontal cross-sectional shape. In additional embodiments, one or more of the additional opening 134 is formed to exhibit a different horizontal cross-sectional shape, such as a non-circular horizontal cross-sectional shape (e.g., one or more of an oblong shape, an elliptical shape, a square shape, a rectangular shape, a tear drop shape, a semicircular shape, a tombstone shape, a crescent shape, a triangular shape, a kite shape, and an irregular shape) than one or more other of the first openings 122.

Each of the additional openings 134 may be formed to have a desired horizontal position relative to the plug structure 130 associated therewith (e.g., partially exposed thereby). As shown in FIG. 1F, in some embodiments, each additional opening 134 is formed to have a horizontal center offset from (e.g., unaligned with) a horizontal center of the plug structure 130 associated therewith. In additional embodiments, at least one (e.g., each) of the additional opening 134 is formed to have a horizontal center substantially aligned with a horizontal center of the plug structure 130 in contact therewith. Each of the additional openings 134 may have the same horizontal position relative to the plug structure 130 associated therewith as each other of the additional openings 134, or one or more of the additional openings 134 may have a different horizontal position relative to the plug structure 130 associated therewith than one or more other of the additional openings 134. In some embodiments, at least some of the additional openings 134 have a different horizontal position relative to the plug structure 130 associated therewith than at least some other of the additional openings 134. For example, some of the additional openings 134 may have horizontal centers offset from horizontal centers of the plug structures 130 associated therewith in the negative X-direction (as depicted in FIG. 1F), and some other of the additional openings 134 may have horizontal centers offset from horizontal centers of the plug structures 130 associated therewith in the positive X-direction. The horizontal positions of the additional openings 134 may at least partially depend on the horizontal positions of the plug structure 130 as well as desired horizontal positions of additional conductive structures (e.g., conductive routing structures, conductive line structures) to be formed through subsequent processing acts, as described in further detail below with reference to FIGS. 1G through 1I.

Figure 1G:
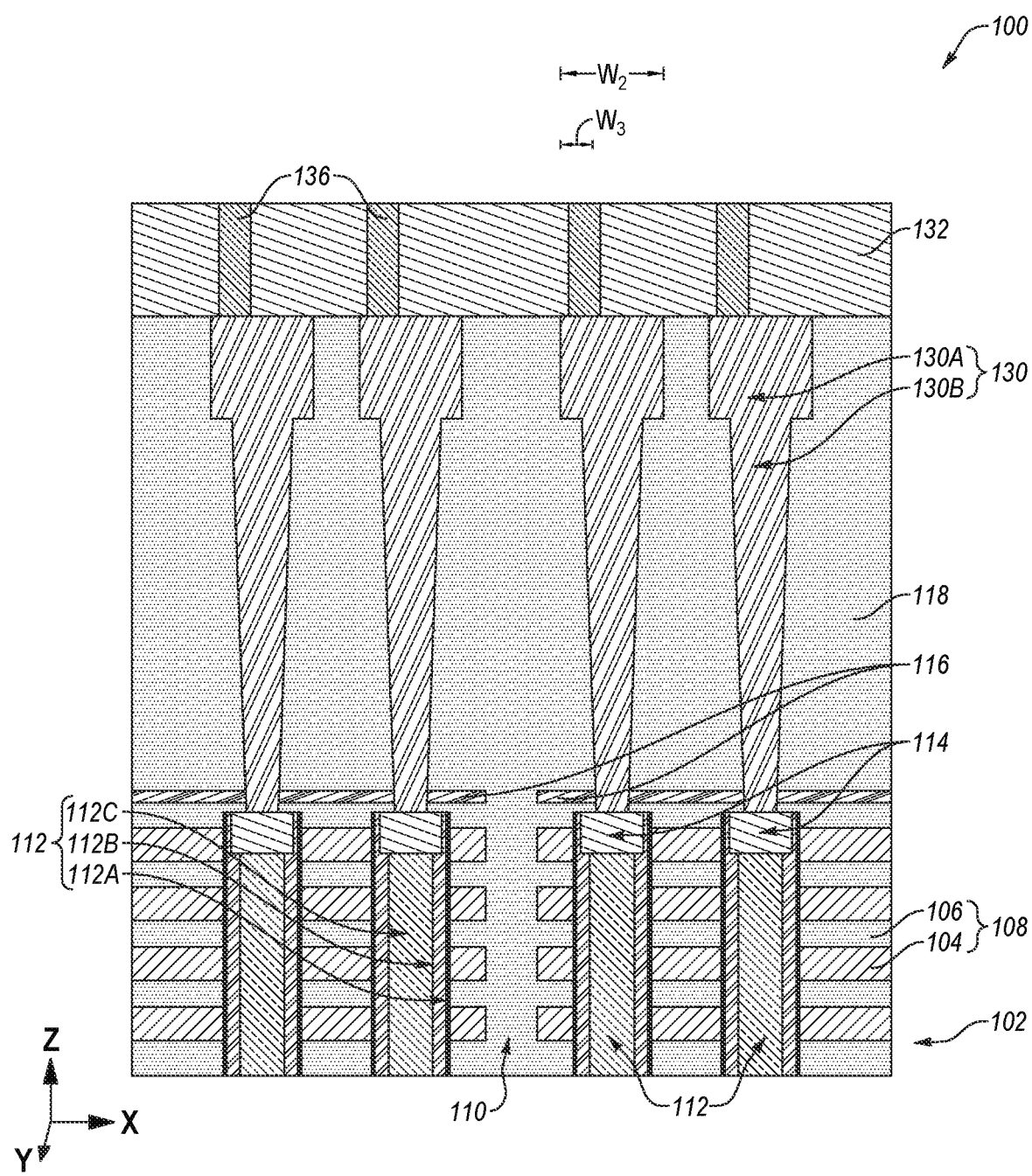
Figure 1H:
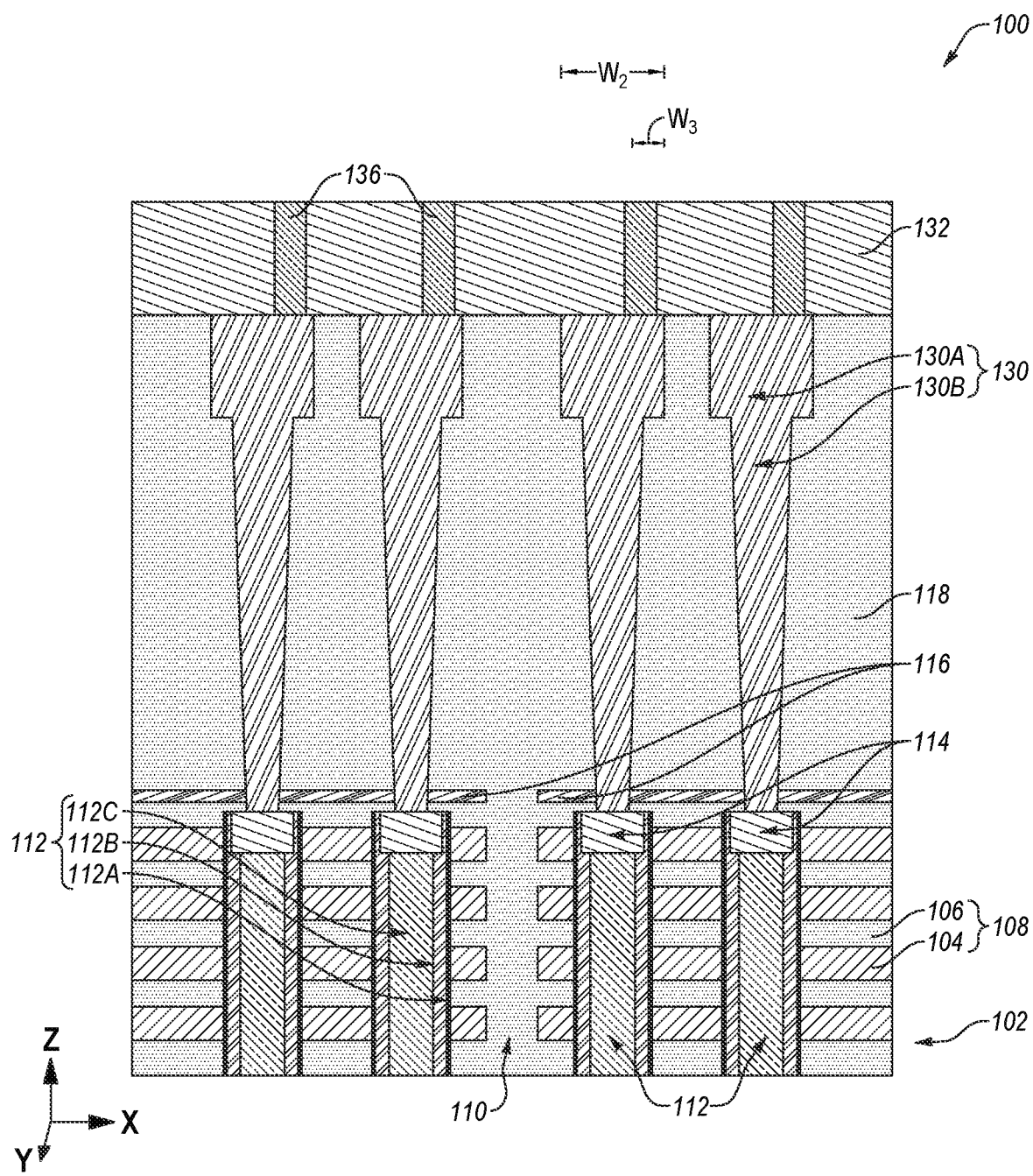
Figure 1I:
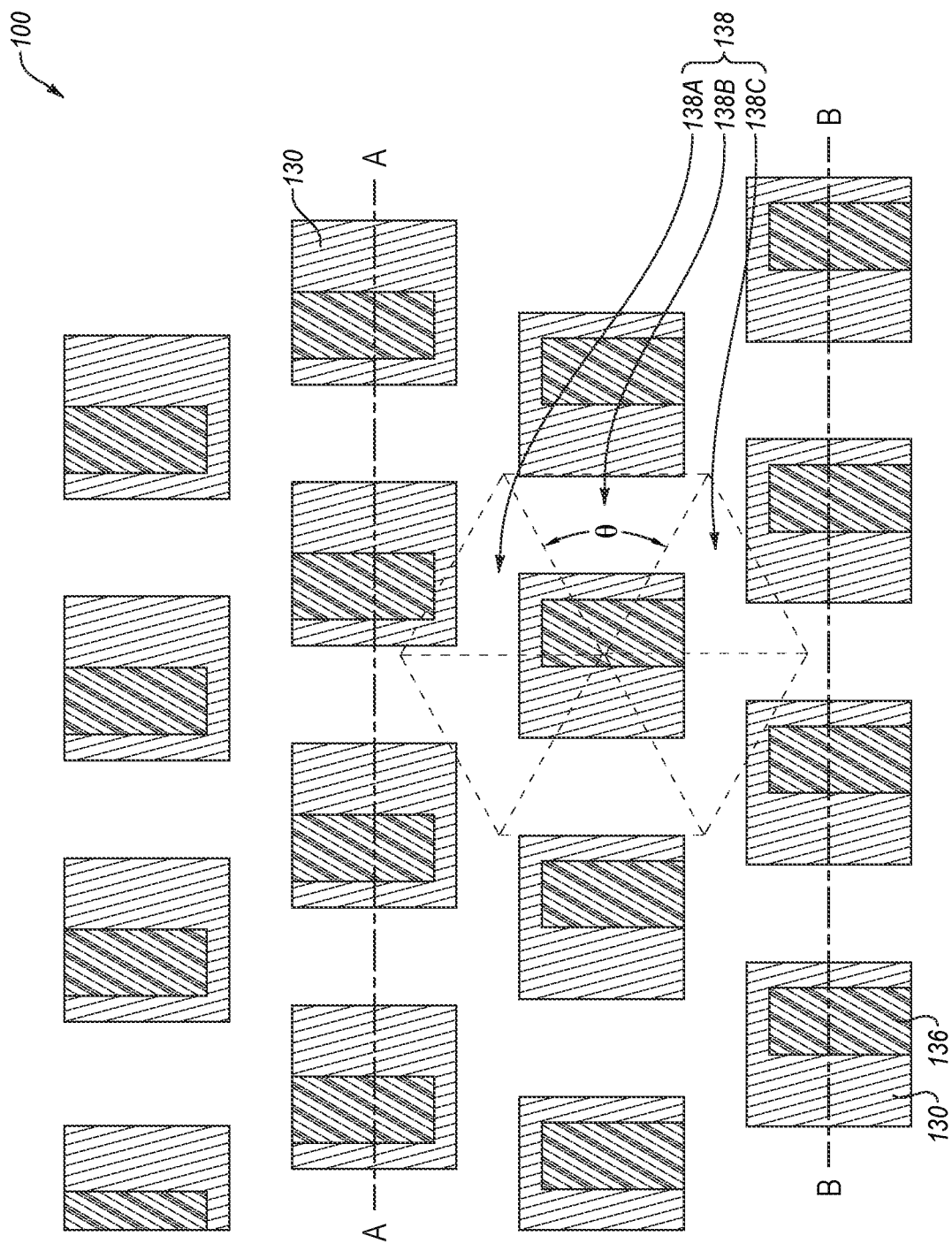

Next, referring to FIG. 1G, additional contact structures 136 (e.g., digit line contact structures, bit line contact structures) may be formed inside the additional openings 134 (FIG. 1F). The additional contact structures 136 may be employed to couple the plug structures 130 (and, hence, the pillar contact structures 114 and the cell pillar structures 112) to conductive structures (e.g., conductive routing structures, conductive line structures) to subsequently be formed on or over the microelectronic device structure 100. By way of non-limiting example, the additional contact structures 136 may couple the plug structures 130 to digit line structures (e.g., bit line structures, data line structures) of a microelectronic device (e.g., a memory device, such as a 3D NAND Flash memory device) including the microelectronic device structure 100, as described in further detail below with reference to FIG. 2. FIG. 1I is a simplified partial top-down view of the microelectronic device structure 100 depicted in FIG. 1G, wherein the view depicted in FIG. 1G is a simplified partial cross-sectional view of the microelectronic device structure 100 about the dashed line A-A illustrated in FIG. 1I. In addition, FIG. 1H is a simplified partial cross-sectional view of the microelectronic device structure 100 about the dashed line B-B illustrated in FIG. 1I.

Referring to FIG. 1G, the additional contact structures 136 may be substantially confined within boundaries (e.g., horizontal boundaries, vertical boundaries) of the additional openings 134 (FIG. 1F), and may substantially fill the additional openings 134 (FIG. 1F). Each additional contact structure 136 may have a geometric configuration (e.g., shape, dimensions) and a horizontal position (e.g., in the X-direction and the Y-direction) corresponding to (e.g., substantially the same as) a geometric configuration of an individual additional opening 134 (FIG. 1F) filled with the additional contact structure 136. As shown in FIG. 1G, each additional contact structure 136 may exhibit an uppermost vertical boundary (e.g., an uppermost surface) substantially coplanar with an uppermost vertical boundary (e.g., an uppermost surface) of the additional dielectric material 132, and a lowermost vertical boundary (e.g., a lowermost surface) vertically adjacent an uppermost vertical boundary (e.g., an uppermost surface) of an individual plug structure 130.

Referring to FIG. 1I, additional contact structures 136 horizontally offset from one another in the Y-direction (e.g., within different rows than one another) may be horizontally offset from one another in the X-direction. Such horizontal offset is controlled by the associated horizontal offset of the additional openings 134 (FIG. 1F), which, as previously discussed, at least partially depends on the horizontal positions of the plug structures 130 (and, hence, horizontal positions of the pillar contact structures 114 (FIGS. 1G and 1H)) and the cell pillar structures 112 (FIGS. 1G and 1H) and on horizontal positions of additional conductive structures (e.g., conductive routing structures, conductive line structures) to subsequently be formed on or over the microelectronic device structure 100. For example, the additional contact structures 136 may be horizontally positioned on the plug structures 130 such that digit line structures to be subsequently formed in contact (e.g., physical contact, electric contact) with the additional contact structures 136 are separated (e.g., spaced) from one another by a desirable distance.

As shown in FIG. 1I, in some embodiments, the plug structures 130 (and, hence, the pillar contact structures 114 (FIGS. 1G and 1H) and the cell pillar structures 112 (FIGS. 1G and 1H)) are arranged in a hexagonal pattern (e.g., a hexagonal grid, a hexagonal array). The hexagonal pattern exhibits a repeating horizontal arrangement of seven (7) plug structures 130, wherein one (1) of the seven (7) plug structures 130 is substantially horizontally centered between six (6) other of the seven (7) plug structures 130. The hexagonal pattern exhibits different three (3) axes of symmetry 138 (e.g., a first axis of symmetry 138A, a second axis of symmetry 138B, and a third axis of symmetry 138C) in the same lateral plane (e.g., the XY plane) about a center of the horizontally centered plug structure 130 of the seven (7) plug structures 130. Different axes of symmetry 138 directly radially adjacent to one another may be radially separated from one another by an angle θ of about 60 degrees. The hexagonal pattern of the plug structures 130 exhibits a smaller lateral area relative to a conventional square pattern having the same type and quantity of plug structures 130. In such embodiments, the additional contact structures 136 and subsequently formed digit line structures may be positioned in view of the hexagonal pattern of the plug structures 130 such that each subsequently formed digit line structure horizontally extends in the Y-direction, contacts (e.g., physically contacts, electrically contacts) an individual additional contact structure 136, and is horizontally separated from horizontally neighboring digit line structures by a predetermined distance in the X-direction. By way of non-limiting example, as depicted in FIG. 1I, additional contact structures 136 of a first group (e.g., the group shown in FIG. 1G) of the additional contact structures 136 positioned along the dashed line A-A may have horizontal centers offset in the negative X-direction (e.g., the left direction) from horizontal centers of the plug structures 130 in contact therewith; and additional contact structures 136 of a second group (e.g., the group shown in FIG. 1H) of the additional contact structures 136 positioned along the dashed line B-B may have horizontal centers offset in the positive X-direction (e.g., the right direction) from horizontal centers of the plug structures 130 in contact therewith.

The additional contact structures 136 may be formed of and include conductive material. As a non-limiting example, the additional contact structures 136 may be formed of and include one or more of at least one metal, at least one alloy, and at least one conductive metal-containing material (e.g., a conductive metal nitride, a conductive metal silicide, a conductive metal carbide, a conductive metal oxide). A material composition of the additional contact structures 136 may be substantially the same as a material composition of one or more (e.g., each) of the plug structures 130 and the pillar contact structures 114, or the material composition of the additional contact structures 136 may be different than the material composition of one or more (e.g., each) of the plug structures 130 and the pillar contact structures 114. In some embodiments, the additional contact structures 136 are formed of and include W. The additional contact structures 136 may individually be homogeneous, or the additional contact structures 136 may individually be heterogeneous.

Thus, in accordance with embodiments of the disclosure, a microelectronic device pillar structures comprising semiconductive material, contact structures in physical contact with upper portions of the pillar structures, and conductive structures over and in physical contact with the contact structures. Each of the conductive structures comprises an upper portion having a first width, and a lower portion vertically interposed between the upper portion and the contact structures. The lower portion has a tapered profile defining additional widths varying from a second width less than the first width at an uppermost boundary of the lower portion to a third width less than the second width at a lowermost boundary of the lower portion.

Furthermore, in accordance with embodiments of the disclosure, a method of forming a microelectronic device comprises forming contact structures in physical contact with upper portions of pillar structures comprising semiconductive material. An etch stop material is formed over the contact structures. A dielectric material is formed over the etch stop material. The dielectric material and the etch stop material are patterned to form apertures extending to the contact structures. Each of the apertures comprises an upper portion exhibiting a substantially uniform width, and a lower portion vertically below the upper portion and exhibiting multiple widths. The multiple widths of the lower portion decrease toward the contact structures from an additional width smaller than the substantially uniform width of the upper portion to a further width smaller than the additional width. Conductive structures are formed within the apertures. The conductive structures substantially fill the apertures and physically contact the contact structures.

Microelectronic device structures (e.g., the microelectronic device structure 100 at or following the processing stage previously described with reference to FIGS. 1G through 1I) of the disclosure may be included in microelectronic devices of the disclosure. For example, FIG. 2 illustrates a partial cutaway perspective view of a portion of a microelectronic device 201 (e.g., a memory device, such as a 3D NAND Flash memory device) including a microelectronic device structure 200. The microelectronic device structure 200 may be substantially similar to the microelectronic device structure 100 at or following the processing stage previously described with reference to FIGS. 1G through 1I. For clarity and ease of understanding the drawings and associated description, some features (e.g., structures, materials) of the microelectronic device structure 100 previously described herein are not shown in FIG. 2. However, it will be understood that any features of the microelectronic device structure 100 at or following the processing stage previously described with reference to FIGS. 1G through 1I that have been described herein with reference to one or more of FIGS. 1A through 1I may be included in the microelectronic device structure 200 of the microelectronic device 201 described herein with reference to FIG. 2.

Figure 2:
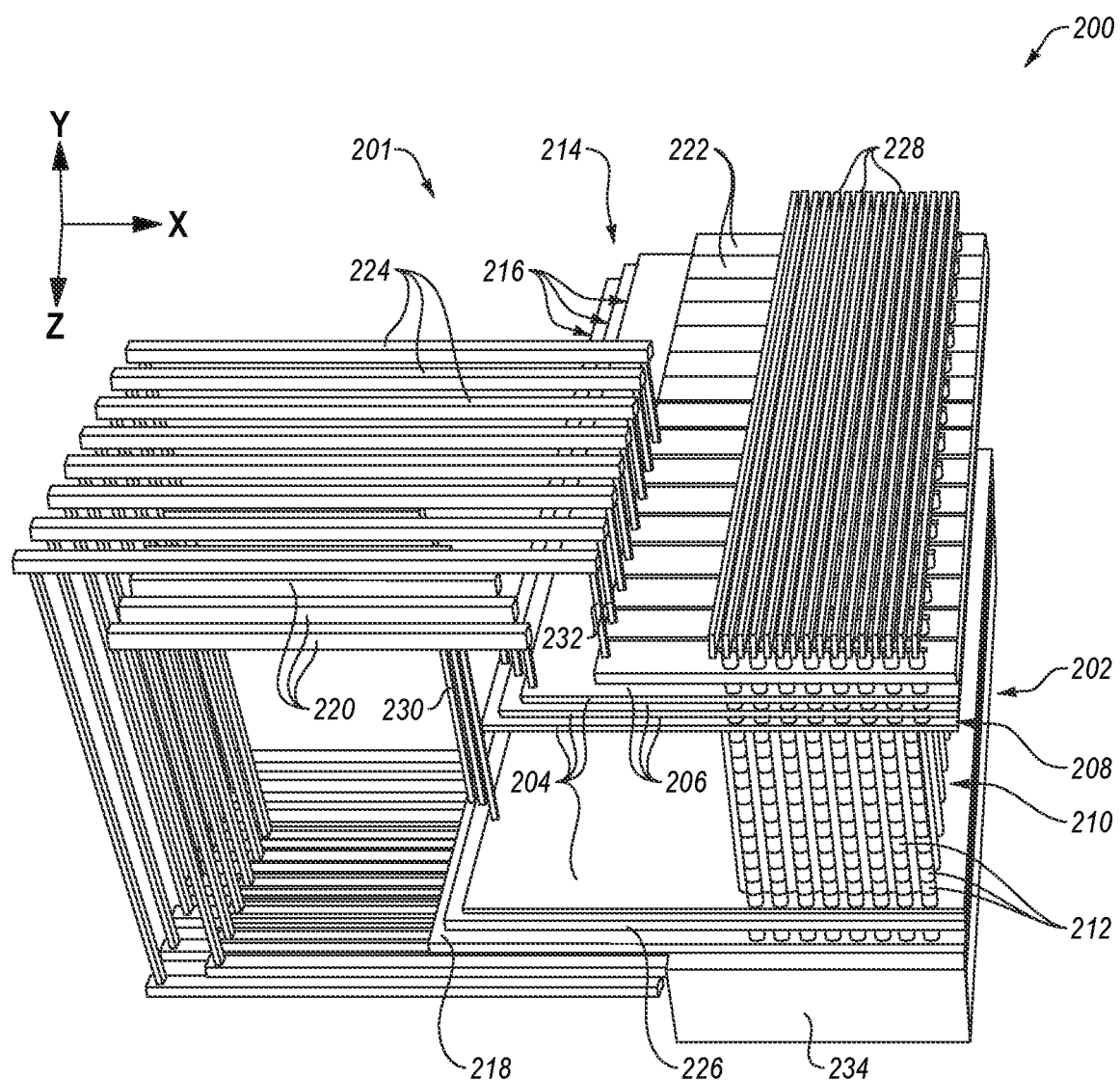
FIG. 2 is a simplified partial cutaway perspective view of a microelectronic device, in accordance with embodiments of the disclosure.

As shown in FIG. 2, the microelectronic device structure 200 may include a stack structure 202 including a vertically alternating (e.g., in the Z-direction) sequence of conductive structures 204 and insulative structures 206 arranged in tiers 208 each including at least one of the conductive structures 204 vertically adjacent at least one of the insulative structures 206. The stack structure 202, the conductive structures 204, the insulative structures 206, and the tiers 208 may respectively correspond to (e.g., be substantially the same as) the stack structure 102, the conductive structures 104, the insulative structures 106, and the tiers 108 previously described with reference to FIG. 1A. In addition, the microelectronic device structure 200 includes cell pillar structures 210 substantially similar to the cell pillar structures 112 previously described with reference to FIG. 1A vertically extend through the stack structure 202. Intersections of the cell pillar structures 210 and the conductive structures 204 of the stack structure 202 form strings of memory cells 212 vertically extending through the stack structure 202. The conductive structures 204 may serve as local access line structures (e.g., local word line structures) for the strings of memory cells 212. Furthermore, the microelectronic device 201 may also include one or more staircase structures 214 having steps 216 defined by edges (e.g., horizontal ends in the X-direction) of the tiers 208 of the stack structure 202. The steps 216 of the staircase structures 214 may serve as contact regions for the conductive structures 204 of the stack structure 202.

The microelectronic device 201 may further include at least one source structure 218, access line routing structures 220, first select gates 222 (e.g., upper select gates, drain select gates (SGDs)), select line routing structures 224, one or more second select gates 226 (e.g., lower select gates, source select gate (SGSs)), digit line structures 228, access line contact structures 230, and select line contact structures 232. The digit line structures 228 may be coupled to the cell pillar structures 210 by way of additional contact structures, plug structures, and pillar contact structures substantially similar to the additional contact structures 136, the plug structures 130, and the pillar contact structures 114 previously described with reference to FIGS. 1G through 1I, respectively. For example, the digit line structures 228 may vertically overlie and physically contact the additional contact structures (e.g., the additional contact structures 136 (FIGS. 1G through 1I)); the additional contact structures may vertically overlie and physically contact the plug structures (e.g., the plug structures 130 (FIGS. 1G through 1I)); the plug structures may vertically overlie and physically contact the pillar contact structures (e.g., the pillar contact structures 114 (FIGS. 1G and 1H)); and the pillar contact structures may physically contact the cell pillar structures 210 (e.g., corresponding to the cell pillar structures 112 (FIGS. 1G and 1H)). In addition, the access line contact structures 230 and the select line contact structures 232 may couple additional features of the microelectronic device 201 to one another as shown (e.g., the select line routing structures 224 to the first select gates 222, the access line routing structures 220 to the conductive structures 204 of the tiers 208 of the stack structure 202).

The microelectronic device 201 may also include a base structure 234 positioned vertically below the cell pillar structures 210 (and, hence, the strings of memory cells 212). The base structure 234 may include at least one control logic region including control logic devices configured to control various operations of other features (e.g., the strings of memory cells 212) of the microelectronic device 201. As a non-limiting example, the control logic region of the base structure 234 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 234 may be coupled to the source structure 218, the access line routing structures 220, the select line routing structures 224, and the digit line structures 228. In some embodiments, the control logic region of the base structure 234 includes CMOS (complementary metal-oxide-semiconductor) circuitry. In such embodiments, the control logic region of the base structure 234 may be characterized as having a "CMOS under Array" ("CuA") configuration.

Thus, in accordance with embodiments of the disclosure, a memory device comprises a stack structure, at least one source structure, cell pillar structures, cell contact structures, conductive plug structures, and digit line structures. The stack structure comprises a vertically alternating sequence of insulative structures and conductive structures. The at least one source structure underlies the stack structure. The cell pillar structures vertically extend through the stack structure and are coupled to the at least one source structure. The cell contact structures are coupled to cell pillar structures. The conductive plug structures overlie and are coupled to the cell contact structures. Each of the conductive plug structures comprises a first portion having first horizontal boundaries extending substantially perpendicular to upper surfaces of the cell contact structures, and a second portion underlying the first portion and having second horizontal boundaries exhibiting a tapered shape. The digit line structures overlie and are coupled to the conductive plug structures.

Figure 3:
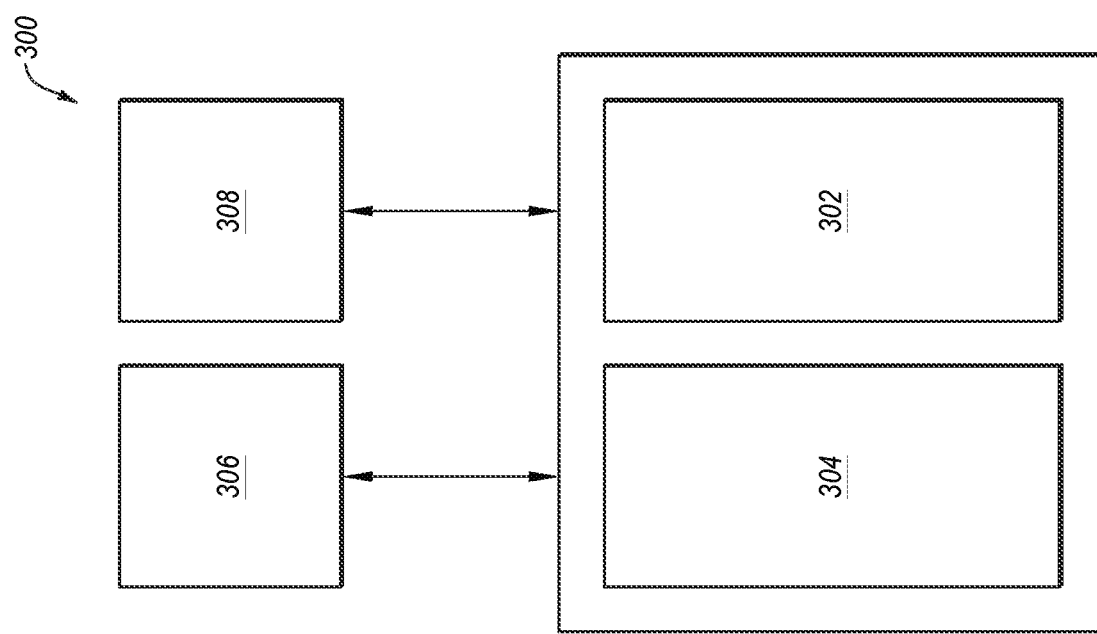
FIG. 3 is a schematic block diagram illustrating an electronic system, in accordance with embodiments of the disclosure.

Microelectronic devices structures (e.g., the microelectronic device structure 100 at or following the processing stage previously described with reference to FIGS. 1G through 1I) and microelectronic devices (e.g., the microelectronic device 201 (FIG. 2)) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, one or more of a microelectronic device structure (e.g., the microelectronic device structure 100 (FIGS. 1G through 1I)) and a microelectronic device (e.g., the microelectronic device 201 (FIG. 2)) previously described herein. The electronic system 300 may further include at least one electronic signal processor device 304 (often referred to as a "microprocessor"). The electronic signal processor device 304 may, optionally, include one or more of a microelectronic device structure (e.g., the microelectronic device structure 100 (FIGS. 1G through 1I)) and a microelectronic device (e.g., the microelectronic device 201 (FIG. 2)) previously described herein. While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure (e.g., the microelectronic device structure 100 (FIGS. 1G through 1I)) and a microelectronic device (e.g., the microelectronic device 201 (FIG. 2)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising vertically extending strings of memory cells coupled to access line structures and at least one source structure, conductive structures overlying and coupled to the vertically extending strings of memory cells, and digit line structures overlying and coupled to the conductive structures. Each of the conductive structures comprises an upper portion having a substantially uniform horizontal cross-sectional area throughout a vertical height thereof, and a lower portion underlying the upper portion and having variable horizontal cross-sectional areas throughout a vertical height thereof. The variable horizontal cross-sectional areas decrease from a first horizontal cross-sectional area at an upper boundary of the lower portion to a second, smaller cross-sectional area at a lower boundary of the lower portion.

The structures and devices of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. For example, the methods and structures of the disclosure may reduce undesirable capacitive coupling between horizontally neighboring conductive structures (e.g., horizontally neighboring plug structures coupling digit line structures to vertically extending strings of memory cells) as compared to conventional methods and structures while maintaining or even decreasing feature sizes. The structures and devices of the disclosure may also improve scalability, efficiency, and simplicity as compared to conventional structures and conventional devices.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
a first dielectric material overlying vertically extending strings of memory cells;
a second dielectric material overlying and having a different material composition than the first dielectric material; and
conductive contact structures vertically extending through the first dielectric material and the second dielectric material, the conductive contact structures coupled to the vertically extending strings of memory cells and individually comprising:
a first portion confined within second dielectric material and having a substantially uniform horizontal cross-sectional area across a vertical height thereof; and
a second portion underlying and unitary with the first portion, the second portion vertically extending through the second dielectric material and the first dielectric material and having a non-uniform horizontal cross-sectional area across a vertical height thereof.

2. The microelectronic device of claim 1, wherein:
the first dielectric material comprises a carbon nitride material; and
the second dielectric material comprises a silicon oxide material.

3. The microelectronic device of claim 1, wherein a maximum horizontal cross-sectional area of the second portion of one of the conductive contact structures is less than the substantially uniform horizontal cross-sectional area of the first portion of the one of the conductive contact structures.

4. The microelectronic device of claim 3, wherein horizontal centers of the first portion and the second portion of the one of the conductive contact structures are substantially horizontally aligned with one another.

5. The microelectronic device of claim 4, wherein the horizontal centers of the first portion and the second portion of the one of the conductive contact structures are substantially horizontally aligned with a horizontal center of one of the vertically extending strings of memory cells.

6. The microelectronic device of claim 3, wherein the first portion and the second portion of the one of the conductive contact structures each have a substantially circular horizontal cross-section shape.

7. The microelectronic device of claim 3, wherein the second portion of the one of the conductive contact structures comprises:
- a maximum horizontal width at a vertical position proximate the second portion of the one of the conductive contact structures; and
- a minimum horizontal width at an additional vertical position proximate one of the vertically extending strings of memory cells.

8. The microelectronic device of claim 7, wherein the second portion of the one of the conductive contact structures exhibits a tapered vertical profile defined by horizontal widths progressively decreasing from the maximum horizontal width to the minimum horizontal width.

9. The microelectronic device of claim 1, wherein the first portion of the one of the conductive contact structures vertically extends through less than one half of a vertical thickness of the second dielectric material.

10. The microelectronic device of claim 1, wherein the conductive contact structures individually comprise tungsten within the first portion and the second portion thereof.

11. A memory device, comprising:
- a stack structure comprising conductive structures vertically interleaved with insulative structures;
- strings of memory cells vertically extending through the stack structure;
- a source structure vertically underlying the stack structure and coupled to the strings of memory cells;
- conductive plug structures vertically overlying and in electrical communication with the strings of memory cells, at least one of the conductive plug structures comprising:
  - a first portion having a substantially uniform horizontal width across a vertical height thereof; and
  - a second portion underlying and unitary with the first portion and having variable horizontal widths across a vertical height thereof, the second portion comprising:
    - a largest horizontal width at a vertical position most proximate to the first portion; and
    - a smallest horizontal width at an additional vertical position most proximate to the strings of memory cells; and
- digit line structures vertically overlying and in electrical communication with the conductive plug structures.

12. The memory device of claim 11, further comprising:
- carbon-containing material vertically overlying the stack structure, the carbon-containing material partially vertically overlapping the second portion of the at least one of the conductive plug structures; and
- dielectric material on the carbon-containing material, the dielectric material partially vertically overlapping the second portion of the at least one of the conductive plug structures and completely vertically overlapping the first portion of the at least one of the conductive plug structures.

13. The memory device of claim 12, wherein:
the carbon-containing material comprises a carbon nitride material; and
the dielectric material comprises silicon dioxide.

14. The memory device of claim 11, wherein:
the substantially uniform horizontal width of the first portion of the at least one of the conductive plug structures is greater than the largest horizontal width of the second portion of the at least one of the conductive plug structures; and
a horizontal center of the first portion of the at least one of the conductive plug structures is substantially aligned with a horizontal center of the second portion of the at least one of the conductive plug structures.

15. The memory device of claim 11, further comprising conductive contact structures vertically extending from the conductive contact structures to the digit line structures.

16. The memory device of claim 15, wherein horizontal centers of the conductive contact structures are horizontally offset from horizontal centers of the conductive plug structures in electrical contact therewith.

17. The memory device of claim 11, wherein the conductive plug structures are arranged in a hexagonal pattern.

18. The memory device of claim 11, further comprising control logic circuitry vertically underlying the source structure and in electrical communication with the source structure, the digit line structures, and the conductive structures of the stack structure.

19. An electronic system, comprising:
- a processor device operably connected to an input device and an output device; and
- a memory device operably connected to the processor device and comprising:
  - a stack structure comprising conductive material and insulative material vertically alternating with the conductive material;
  - strings of memory cells vertically extending through the stack structure;
  - a source structure vertically underlying the stack structure and in electrical communication with the strings of memory cells;
  - digit lines vertically overlying the stack structure;
  - conductive contact structures vertically overlying the stack structure and coupling the strings of memory cells to the digit lines, the conductive contact structures individually comprising:
    - a first portion having a substantially uniform horizontal cross-sectional area across an entire vertical dimension thereof; and
    - a second portion underlying and unitary with the first portion and having a non-uniform horizontal cross-sectional area across an entire vertical dimension thereof; and
  - control logic circuitry vertically underlying the source structure and in electrical communication with the strings of memory cells.

20. The electronic system of claim 19, wherein the memory device comprises a 3D NAND Flash memory device.

* * * * *

UNITED STATES PATENT AND TRADEMARK OFFICE
CERTIFICATE OF CORRECTION

PATENT NO. : 11,901,292 B2
APPLICATION NO. : 17/819019
DATED : February 13, 2024
INVENTOR(S) : Shuangqiang Luo and Indra V. Chary It is certified that error appears in the above-identified patent and that said Letters Patent is hereby corrected as shown below:

In the Specification

Column 3, Line 25, change "predetermined way." to --pre-determined way.--
Column 7, Line 61, change "(e.g., $SiN_g$, such as" to --(e.g., $SiN_y$, such as--

Signed and Sealed this
Second Day of April, 2024

Katherine Kelly Vidal
*Director of the United States Patent and Trademark Office*